FREQUENCY MODULATED SIGNAL SWITCHING WITH FREQUENCY DIVIDED OUTPUT
Filed Nov. 13, 1967
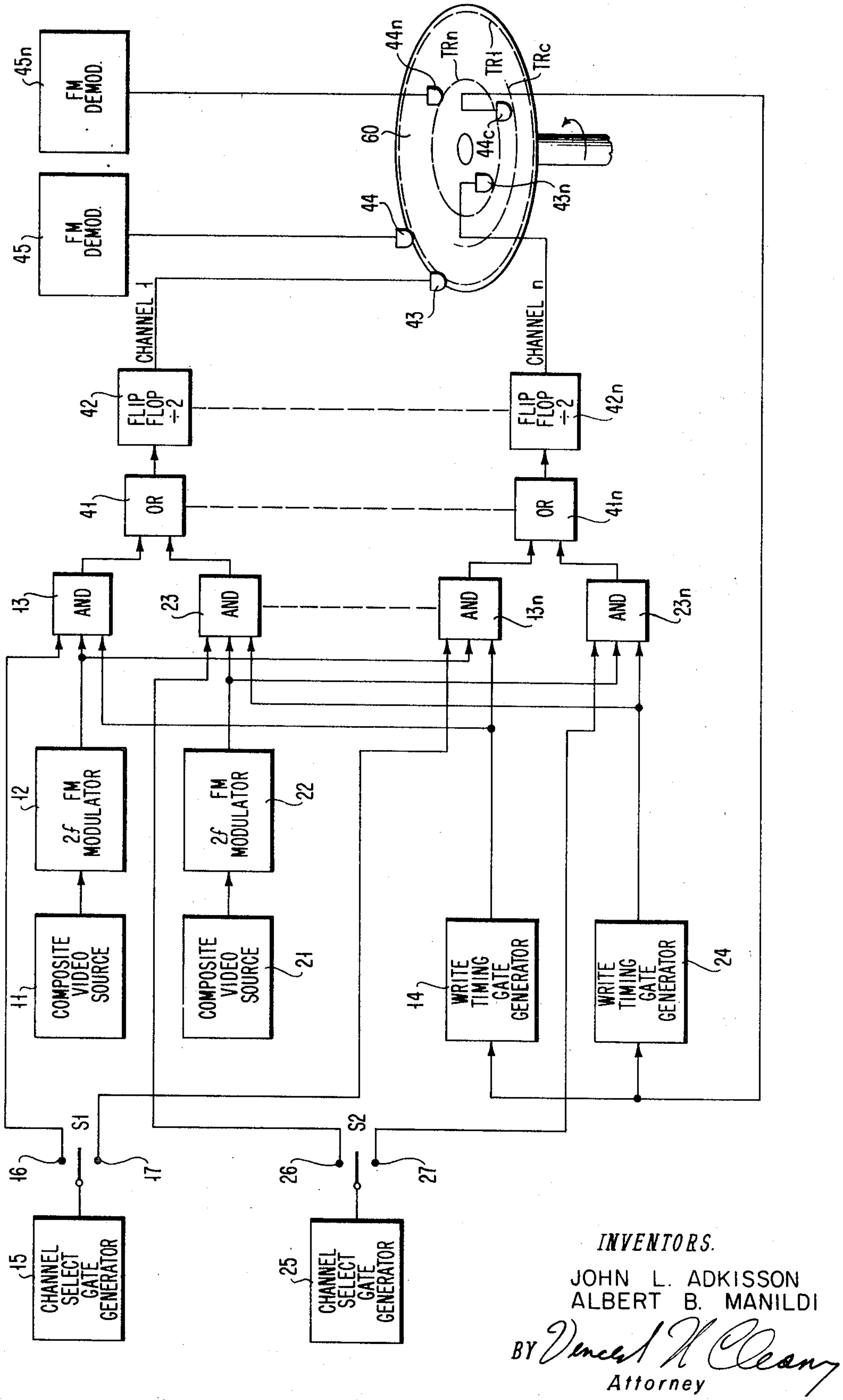
INVENTORS.
JOHN L. ADKISSON
ALBERT B. MANILDI
BY [signature]
Attorney 3,522,372
FREQUENCY MODULATED SIGNAL SWITCHING WITH FREQUENCY DIVIDED OUTPUT

John L. Adkisson and Albert B. Manildi, San Jose, Calif., assignors to International Business Machines Corporation, Armonk, N.Y., a corporation of New York Filed Nov. 13, 1967, Ser. No. 682,432
Int. Cl. H04l *27/12;* H04n *5/78;* G11b *5/04*
U.S. Cl. 178—6 6 Claims

ABSTRACT OF THE DISCLOSURE

A multi-channel storage system for frequency modulated video information having a plurality of sources of frequency modulated information. Each of the sources has a center frequency twice the center frequency of the stored signal. The modulators are switched into a desired channel by standard logic circuitry for storage in a disk type storage. After, however, the information has been switched toward the desired channel, the center frequency is divided by two and then stored in a storage disk. By so doing, only the turn-off or the turn-on times of the logic circuitry are employed so that the turn-off and turn-on times of the logic circuitry do not have to be equal or symmetrical. Thus the difference between the turn-on and turn-off times of the logic circuitry will not produce phase distortion.

BACKGROUND OF THE INVENTION

Field of the invention

A switching system for a plurality of frequency modulated signals.

Description of the prior art

In storing frequency modulation or zero crossing information, such as video information, in a file, it is necessary to switch the information in a selected storage channel. In the past, in order to perform this switching, mechanical switches have been utilized. These switches, however, have been found to be undesirable due to their slow speed and unreliability. Analog electronic switches have also been employed. However, using these switches results in a relatively high amount of cross talk. When logic switches are employed, the frequency modulated signal will turn on and off the logic switches during the switching. As a result, the information is contained both in the turning-on and the turning-off of the switches. However, the turn-on and turn-off times of the logic switches are normally different so as to produce a phase distortion during the switching.

SUMMARY OF THE INVENTION

It is therefore an object of the invention to provide a new and improved switching system for switching frequency modulation or zero crossing information.

A further object of the invention is the provision of a new and improved switching system for switching frequency modulation information that has a minimum of cross talk and/or phase distortion as a result of the switching.

A still further object of the invention is to provide a new and improved switching system that will accurately, with a minimum of cross talk and with a high degree of repeatability, selectively switch frequency modulation information.

Still a further object of the invention is the provision of a switching system for switching zero crossing information in which the effect of electromagnetic radiation in the system can be minimized.

The above objects of the present invention are accomplished by a system wherein a frequency modulated signal is developed having a center frequency equal to 2N times $f$ where N is any whole integer and $f$ equals the desired center frequency of the signal to be stored. A selection means is employed to selectively switch this signal through a logic switch or gate to a desired channel wherein the information is applied in the form of a frequency modulated signal to a frequency divider. The frequency divider divides the frequency of the switched signal by 2N and then the divided signal is stored in the channel. The requirement for symmetry of turn-on and turn-off times of the switching gates, to prevent phase distortion, disappears, since the information can be obtained from either the positive going or the negative going zero crossings of the swtiched signal.

BRIEF DESCRIPTION OF THE DRAWINGS

The drawing contains a system for switching frequency modulated signals embodying the invention.

DESCRIPTION OF THE PREFERRED EMBODIMENT

General description

Sources of frequency modulation information from modulators 12 and 22 are applied via gating means such as AND gates 13, 23, 13*n*, and 23*n* to a corresponding OR gate and then to a frequency divider. The center frequency of the frequency modulator is twice or 2N times the desired center frequency of the signal to be stored in storage tracks TR1 through TR*n* on disk 60 where N is any whole integer. Hence, switching through the AND gates into the appropriate channels occurs with the switched signals having a center frequency twice the desired frequency of the signal to be stored. After switching, the frequency dividers 42 through 42*n* in the corresponding channel (1 through *n*) divide the center frequency of the FM information by two or 2N. There will be phase distortion from the AND gates 13 and the OR gates, as a result of different turn-on and turn-off times. This will not be seen in the storage tracks since it will now only be necessary to utilize either the turn-on or the turn-off times of this logic circuitry to store all the information. After the center frequency has been divided by the divider in the selected channel, the signal is then applied to a storage track on a disk 60.

Detailed description

The embodiment in the drawing illustrates a composite video source 11 which provides a composite video signal including the synchronizing signals and analog video signals to an FM modulator 12. Another composite video source 21 is connected to an FM modulator 22. It will be understood that although only two FM modulators are shown, a plurality of modulators can be utilized to be switched into a desired storage channel. Each modulator, however, is connected to a switching AND gate for each channel, which in turn will pass the modulated signal through an OR gate and into the channel to be stored on the disk 60. Thus for each channel there will be the same number of switching AND gates as there are sources of FM modulators. More specifically, since there are two sources of FM modulated signals here, channel number 1 includes two AND gates 13 and 23 with modulator number 12 connected to AND gate 13 and modulator 22 connected to AND gate 23. Both of these AND gates can steer or switch the signals into the first channel.

Each modulator, such as frequency modulators 12 and 22, is therefore connected to a switching AND gate for each channel. For purposes of illustration only the first channel and the last or *n*th channel are shown. Thus modulator 12 is shown connected to AND gate 13*n* as well as AND gate 13, AND gate 13*n* being for the last channel. Likewise, modulator 22 is also connected to an AND gate 23*n* for the *n*th channel as well as AND gate 23 in the first channel. Modulators 12 and 22 would also be connected to corresponding AND gates for any intervening channels.

Each modulator has a write timing device or gate generator that applies a "one" pulse to the AND gates that has a time width or duration equal to one revolution of disc 60, and/or one video frame. More specifically, this time period normally would be 33 milliseconds. For each modulator there is a write timing device or gate generator so that write timing device 14 is connected to each AND gate that the modulator 12 is connected to and more specifically, as shown in the drawing, it is connected to AND gate 13 as well as AND gate 13*n*. It would also be connected to any other AND gates that the frequency modulator 12 is connected to in the other intervening channels.

Correspondingly, write timing generator 24 is connected to any AND gate that the modulator 22 is connected to. More specifically, the timing generator 24 is connected to AND gate 23 as well as AND gate 23*n*. In addition, this write timing generator 24 is connected to any other AND gate that the modulator 22 would be connected to in the intervening channels. The write timer 24 also has an output pulse which has a time width or duration equal to one complete revolution of the disk 60. More specifically, the pulse width of the (one) output of write timing device 24 is 33 milliseconds, the time of one video frame (two fields).

Thus, modulator 12 as well as write gate 14 are both connected to each AND gate 13 through 13*n*. Likewise, modulator 22 and write gate generator 24 are connected to each AND gate 23 through 23*n*. The third input for these AND gates is for a channel select gate generator (15 and 25). By a switch S1 the channel select gate generator 15 is selectively connected to AND gates 13 and 13*n* (and AND gates in any intervening channels). Select gate generator 25 is selectively connected through a switch S2 to AND gates 23 and 23*n*. The select generators 15 and 25 merely put a one or higher level onto the input of these AND gates. Thus, the position of switches S1 and S2 determines the AND gates which are enabled to switch the output of modulators 12 and 22 into a channel.

The AND gates 13 and 23 are connected through an OR gate 41 to a frequency divider such as bistable flip-flop 42. Thus, the FM modulated signal coming through OR gate 42 has its frequency divided by two, by the bistable flip-flop 42. It is then applied to, for example, a magnetic head 43, which is magnetically coupled with a track TR1 of a rotating magnetic disc 60. By way of example, a pickup head for the track TR1 is illustrated as number 44, which can read out the signal and apply it to an FM modulator 45 and subsequently to, for example, a television monitor not shown.

AND gates 13*n* through 23*n* are connected through an OR gate 41*n* to a frequency divider such as a bistable flip-flop 42*n* which also divides the frequency of the frequency modulated signal passing through these gates by two. It is then applied to a magnetic head 43*n*, which records the signal on a magnetic track TR*n* of the rotating disk 60. A read-out head 44*n* can read out the track TR*n* to an FM modulator 45*n* so as to be applied, for example, to a television monitor, not shown.

It will be understood that other intervening channels between channel 1 and channel *n* would be recorded on other similar tracks on the disc 60.

OPERATION OF THE INVENTION

As set forth above, each channel has the same number of AND gates as there are FM modulators. In the example set forth above, there are two FM modulators 12 and 22 and consequently there are two AND gates in each channel. Specifically, in channel number 1 there are AND gates 13 and 23 and in the *n*th channel there are two AND gates 13*n* and 23*n*. In addition, there are shown the same number of write timing gate generators as there are FM modulators. More specifically, in the embodiment in the drawing, there are two FM modulators and two write timing gate generators 14 and 24. The write timing gate generator 14 is connected to the same AND gates as modulator 12 and the write timing generator 24 is connected to the same AND gates as modulator 22. As stated above, these gate generators are only on or have a 1 output for 33 milliseconds, which is the time for one revolution of the disc 60 and also the time for one video frame or two video fields. These generators are turned on and off in response to a complete revolution of the disc 60. This can be done preferably by employing a magnetic track TRC on the disc 60 with a magnetic pickup head 44*c*. When utilizing such a track, the generators 14 and 24 could simply be bistable flip-flops which are operative to switch states in response to a pulse on the track TRC on disc 60. Thus, generators 14 and 24 will have a series of "one" output pulses that are 33 milliseconds in time duration.

There are as many channel select gate generators as deemed desirable for selecting the channel for recording. The embodiment in the drawing illustrates two such generators 15 and 25 to accommodate the channels illustrated. It will be understood that a single such generator could be employed which is selectively connectable to all the AND gates 13, 23, etc. in all *n* number of channels. The only requirement for the output of the channel select generator is that it provides a "one" input to the desired AND gate during the time that the corresponding write timing gate generator produces a 33 millisecond "one" pulse. Thus a minimum requirement for the output of these generators is that they have a "one" output for 33 milliseconds, with that time period being in full coincidence with the 33 millisecond pulse from the timing gate generators (14, 24). Thus, it will be seen that as a practical matter, to prevent such a critical timing, the channel select gate generator probably will have a "one" output long before and long after the corresponding write timing gate generator will be "1."

As can be seen, each modulator is connected to an AND gate in each channel at all times. If it is desired to record the output of modulator 12, for example, in the channel number 1, channel select switch S1 connects generator 15 to AND gate 13 through contact 16. Consequently, shortly thereafter, gate generator 14 produces a 33 millisecond "one" pulse. During this time period, therefore, the composite video information from FM modulator 12 passes through AND gate 13 into OR gate 41 and thence to flip-flop 42. The flip-flop 42 can be a commercially available flip-flop of one of two types. That is, a bistable flip-flop which changes state either by a negative going zero crossing or alternatively a bistable flip-flop that changes state only in the presence of a positive going zero crossing. Thus, in either case the flip-flop 42 will change state only at every other zero crossing. As a result, the frequency of the output of flip-flop 42 will be one-half the frequency of the input. Stating it another way, the number of zero crossings at the output of flip-flop 42 will be one-half the number of zero crossings at the input of flip-flop 42. Since only the negative going or the positive going zero crossings switch flip-flop 42, the opposite type of zero crossing (positive or negative respectively) does not effect the flip-flop 42. Consequently, only the turn-on time or the turn-off time of AND gate 13 and OR gate 41 produce an effect at the output of flip-flop 42. As a result, there will be no phase error due to a difference in the turn-on and turn-off times of the AND gates or the OR gate 41.

The output of flip-flop 42 is recorded on a magnetic track TR1 by a magnetic head 43 on buffer disc 60. A read out head 44 can be utilized for track TR1 which conventionally is connected to an FM modulator 45, which then would normally be connected to a television monitor (not shown).

If it is desired to record the information of FM modulator 12 in the *n*th channel, switch S1 will be positioned to connect gate generator 15 through contact 17 to provide a "one" input to the AND gate **13*n*. Thus, during the time of the 33 millisecond "one" pulse from gate 14, the zero crossings will switch AND gate 13*n* on (by positive going zero crossings) and off (by negative going zero crossings) so as to pass these zero crossings through to OR gate 41*n* and then to flip-flop 42*n*. Flip-flop 42*n* is the same as flip-flop 42 and will divide the zero crossings at the input in half or, that is, divide the frequency of the input by two. The output of 42*n*** is then recorded on track TR*n* on disc 60 by head **43*n*. A read-out head 44*n* will supply zero crossing information to the demodulator 45*n***, which is then connected to a television monitor, not shown.

If it is desired to connect the modulator 22 to channel 1, switch S2 is positioned so as to connect gate generator 25 through contact 26 to provide a one to AND gate 23. Thus, during the 33 millisecond one pulse from generator 14, AND gate 23 is switched on and off by modulator 22 so that the zero crossing information, passes through OR gate 41 with the zero crossing divided in half by flip-flop 42 so as to provide one video frame on track TR1.

If it is desired to record the output of modulator 22 on the *n*th track, switch S2 is positioned so that gate generator 25 provides a "one" through contact 27 to AND gate **23*n*. Thus, AND gate 23*n* is switched on and off by the zero crossings from modulator 22 during the 33 millisecond "one" pulse produced by generator 24. This information passes through OR gate 41*n* with the frequency being divided in two by flip-flop 42**, and is thence recorded on track TR*n* through head **43*n***.

The embodiment in the drawing illustrates the zero crossing being divided by two by the flip-flops 42 through **42*n*. It will be understood that rather than dividing the frequency or the number of zero crossings by two, the spirit of the invention is achieved by dividing the frequency by a divisor which is any multiple of two. Consequently, the divisor could be equal to 2N, where N is any whole integer. This could be accomplished by various frequency dividers, for example, counters connecting similar flip-flops such as 42 in series in the channel such as by connecting the output of flip-flop 42 to the input of another flip-flop, etc. In such a case, the output of the last flip-flop would be recorded on disc 60**. Other conventional frequency dividers could be utilized to divide the frequency by a multiple of 2.

It has been discovered that substantial electromagnetic radiation comes from the modulators, the connecting circuitry, the AND gates **13, 23, 13*n*, 23*n*, etc., and the OR gates 41–41*n*. This radiation is easily picked up by the magnetic heads for disc 60 when these elements are located in the vicinity of the disc. This becomes a serious problem when the center frequency of the modulators is the same as the center frequency of the signal recorded on disc 60**. In the present invention, however, the frequency of this radiation is at least twice the center frequency on the disc and consequently can easily be filtered out by conventional filter techniques.

It will be understood that although only two channels are shown, the second channel is the *n*th channel and many intermediate channels having similar connections would normally be employed.

Obviously, many modifications and variations of the present invention are possible in light of the above teachings. It is therefore to be understood that within the scope of the appended claims, the invention may be practiced other than as specifically described and illustrated.

What is claimed is:

1. A system for switching a frequency modulated signal comprising:

a source of a frequency modulated signal having a center frequency equal to 2N times $f$ where N is any whole integer and $f$ equals a desired center frequency;

gating means;

selection means to selectively switch said signal through said gating means;

a frequency divider;

the output of said gating means operatively connected to the input of said divider for application of said signal to said divider; and said divider responsive to divide the center frequency of said signal by 2N.

2. A system for switching as set forth in claim 1 wherein N is one.

3. A system for switching as set forth in claim 1 including another source of another frequency modulated signal having a center frequency equal to 2N times $f$ where N is any whole integer and $f$ equals a desired center frequency.

4. A system for switching as set forth in claim 3 wherein N is one.

5. A system for switching as set forth in claim 3 wherein said signal and said other signal contain video information.

6. A system for switching as set forth in claim 5 including, a channel storage means connected to said divider for storing the output of said divider.

References Cited

UNITED STATES PATENTS

| | | | |
|---|---|---|---|
| 2,874,214 | 2/1959 | Anderson. | |
| 3,466,392 | 9/1969 | Calfee | 178—66 |

ROBERT L. GRIFFIN, Primary Examiner

H. W. BRITTON, Assistant Examiner

U.S. Cl. X.R.

178—6.6, 66; 325—145